(12) United States Patent
Tanaka et al.

(10) Patent No.: US 6,551,143 B2
(45) Date of Patent: Apr. 22, 2003

(54) BATTERY CONNECTOR

(75) Inventors: Kaoru Tanaka, Chiba (JP); Kazuaki Kodaira, Tokyo (JP)

(73) Assignee: Tyco Electronics, AMP, K.K., Kanagawa (JP)

( * ) Notice: Subject to any disclaimer, the term of this patent is extended or adjusted under 35 U.S.C. 154(b) by 0 days.

(21) Appl. No.: 09/982,428

(22) Filed: Oct. 18, 2001

(65) Prior Publication Data
US 2002/0049000 A1 Apr. 25, 2002

(30) Foreign Application Priority Data
Oct. 20, 2000 (JP) ........................................ 2000-320492

(51) Int. Cl.[7] .............................................. H01R 13/10
(52) U.S. Cl. .......................... 439/682; 439/83; 439/856; 439/224; 439/65
(58) Field of Search ................................ 439/682, 660, 439/856, 857, 500, 224, 83, 65

(56) References Cited
U.S. PATENT DOCUMENTS

| | | | |
|---|---|---|---|
| 1,622,631 A | * 3/1927 | Fahnestock | 439/857 |
| 4,193,660 A | * 3/1980 | Jaconette | 439/474 |
| 5,549,480 A | * 8/1996 | Cheng | 439/682 |
| 5,551,883 A | 9/1996 | Davis | 439/65 |
| 5,984,694 A | * 11/1999 | Sinclair | 439/70 |
| 6,024,613 A | * 2/2000 | Mashiyama et al. | 439/851 |
| 6,123,587 A | * 9/2000 | Beloritski et al. | 439/828 |
| 6,171,126 B1 | * 1/2001 | Wu et al. | 439/224 |
| 6,267,629 B1 | * 7/2001 | Nguyen et al. | 174/35 C |

* cited by examiner

Primary Examiner—Tho D. Ta

(57) ABSTRACT

The invention relates to a battery connector equipped with an insulating housing. Contacts are attached to the housing and are soldered to a circuit board. Each of the contacts has a flat-plate-form base part and a pair of side wall parts that rise from both sides of the base part. A pair of contact arms extend, facing each other, from the side wall parts of the pair of side wall parts, and contact mating contacts. The bottom surface of the base part forms a soldering surface that is soldered to the circuit board. The invention increases the soldering strength of the contacts with respect to the circuit board so that separate reinforcing members are not required. The area occupied by the battery connector on the board is also reduced, and the balance of the soldering positions on the bottom surface of the connector is improved.

17 Claims, 6 Drawing Sheets

BATTERY CONNECTOR

BACKGROUND OF THE INVENTION

The present invention relates to a battery connector, and more specifically, to a battery connector used for engagement and connection to a mating connector mounted on a circuit board.

DESCRIPTION OF THE PRIOR ART

Generally, batteries contained in portable telephones consist of one of two types of configurations. These configurations consist of battery packs in which batteries are contained in the back cover of portable telephones, and batteries that are separately disposed on the side of the back cover of portable telephones. The batteries are connected to a circuit board disposed inside the main body of the portable telephone by engaging and connecting a battery connector connected to the batteries to a mating connector mounted on the circuit board.

One conventional battery connector of this type is shown in FIG. 7 (see Japanese Patent Application Kokai No. H7-192797). The battery connector 100 has a housing 110 having a plurality of contact accommodating cavities 111. A plurality of contacts 120 is attached inside the contact accommodating cavities 111. Each of the contacts 120, formed by stamping and bending a metal plate, has a plate-form base part 121 fastened in the housing walls of the contact accommodating cavity 111.

A board connection part 122 is connected by means of soldering to a circuit board (not shown) that is connected to the battery and extends from the lower part of the rear end of the base part 121. A contact part 123 contacts a tab-form mating contact (not shown) of a mating connector and extends from the lower part of the front end of the base part 121. The board connection part 122 has a flat-plate part 124. The flat plate part extends rearward from the lower part of the rear end of the base part 121 and is bent in a direction that is substantially perpendicular to the base part 121. The board connection part 122 also has a leg part 125 that extends rearward from the lower end of the flat-plate part 124 and is connected by soldering to the circuit board.

The contact part 123 has an elastic spring part 126 that extends diagonally to the outside of the plane of thickness of the base part 121 from the lower part of the front end part of the base part 121. A tip end part 128 is bent toward the opposite side from the contact surface of the elastic spring part 126. The tab-form mating contacts of the mating connector enter the interiors of the contact accommodating cavities 111 formed in the housing 110. The mating contacts elastically contact the contact surfaces 127 of the contact parts 123 of the contacts 120. As a result, the battery and the circuit board (not shown) on the mating side are electrically connected.

Because the leg parts 125, which constitute the soldering parts of the contacts 120, are bent from the lower ends of the flat-plate parts 124 that extend from the lower parts of the rear ends of the plate-form base parts 121 that have a relatively large area, the soldering area available for the circuit board is relatively small, causing the soldering strength to be low. Hence, the battery connector 100 may come loose from the circuit board as a result of an impact caused by dropping, etc. Further, attaching separate reinforcing members (not shown) to the housing 110 requires that the reinforcing members be soldered to the circuit board thereby requiring an increase in area occupied by the battery connector 100 on the board. Because the soldering positions of the leg parts 125 are biased with respect to the center, in the short direction on the bottom surface of the battery connector 100, the balance of the soldering positions with respect to the battery connector 100 is also poor. In cases where the mating connector is engaged from the front, there is a danger that the front end side of the housing 110 will float.

It is therefore desirable to develop a battery connector where the soldering strength of the contacts with respect to the circuit board is increased so that no separate reinforcing members are required. It is also desirable to have a battery connector in which the area occupied by the battery connector on the board can be reduced, and in which the balance of the soldering positions on the bottom surface of the connector can be improved.

SUMMARY OF THE INVENTION

This invention relates to a battery connector equipped with an insulating housing. Contacts are attached to the housing and are soldered to a circuit board. Each of the contacts has a flat-plate-form base part and a pair of side wall parts that rise from both sides of the base part. A pair of contact arms extend, facing each other, from the side wall parts of the pair of side wall parts, and contact mating contacts. The bottom surface of the base part forms a soldering surface that is soldered to the circuit board.

BRIEF DESCRIPTION OF THE DRAWINGS

The invention will now be described by way of example with reference to the accompanying drawings wherein.

DETAILED DESCRIPTION OF THE PREFERRED EMBODIMENT

Figure 1:
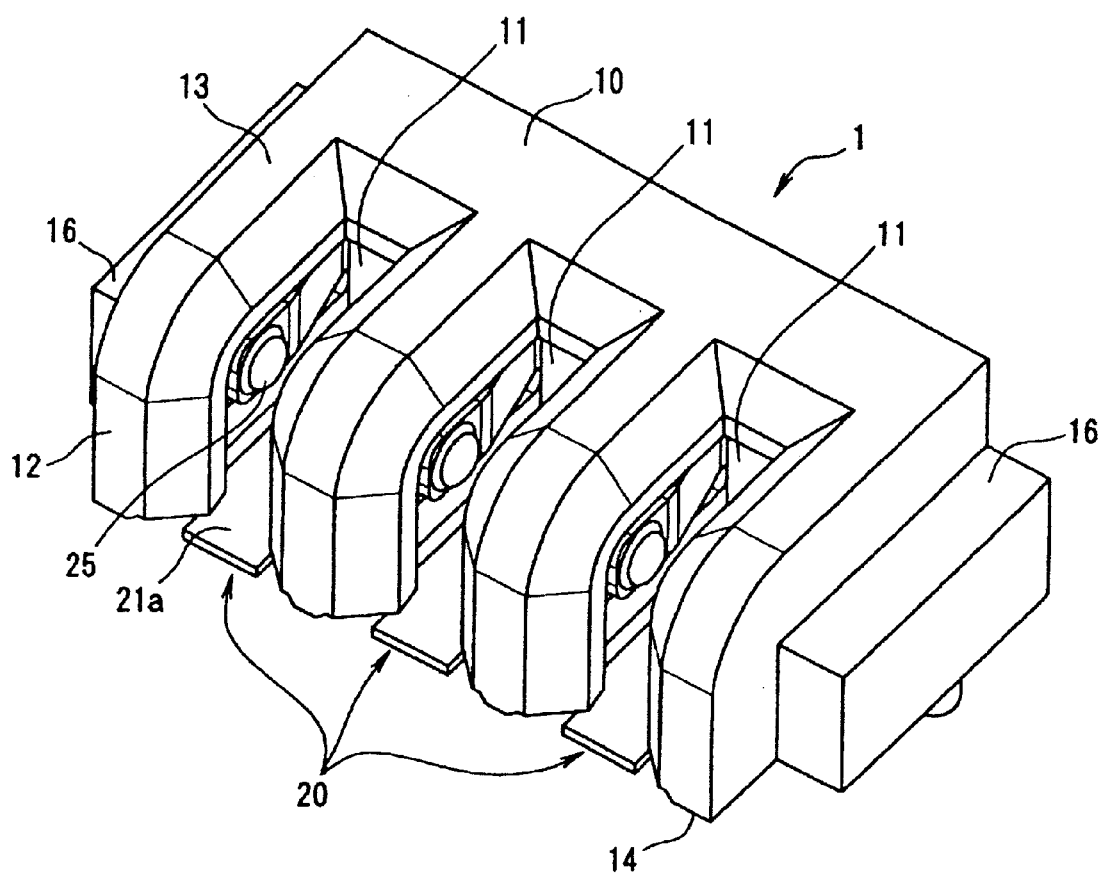
FIG. 1 is a perspective view of the battery connector shown at an inclination.
Figure 2:
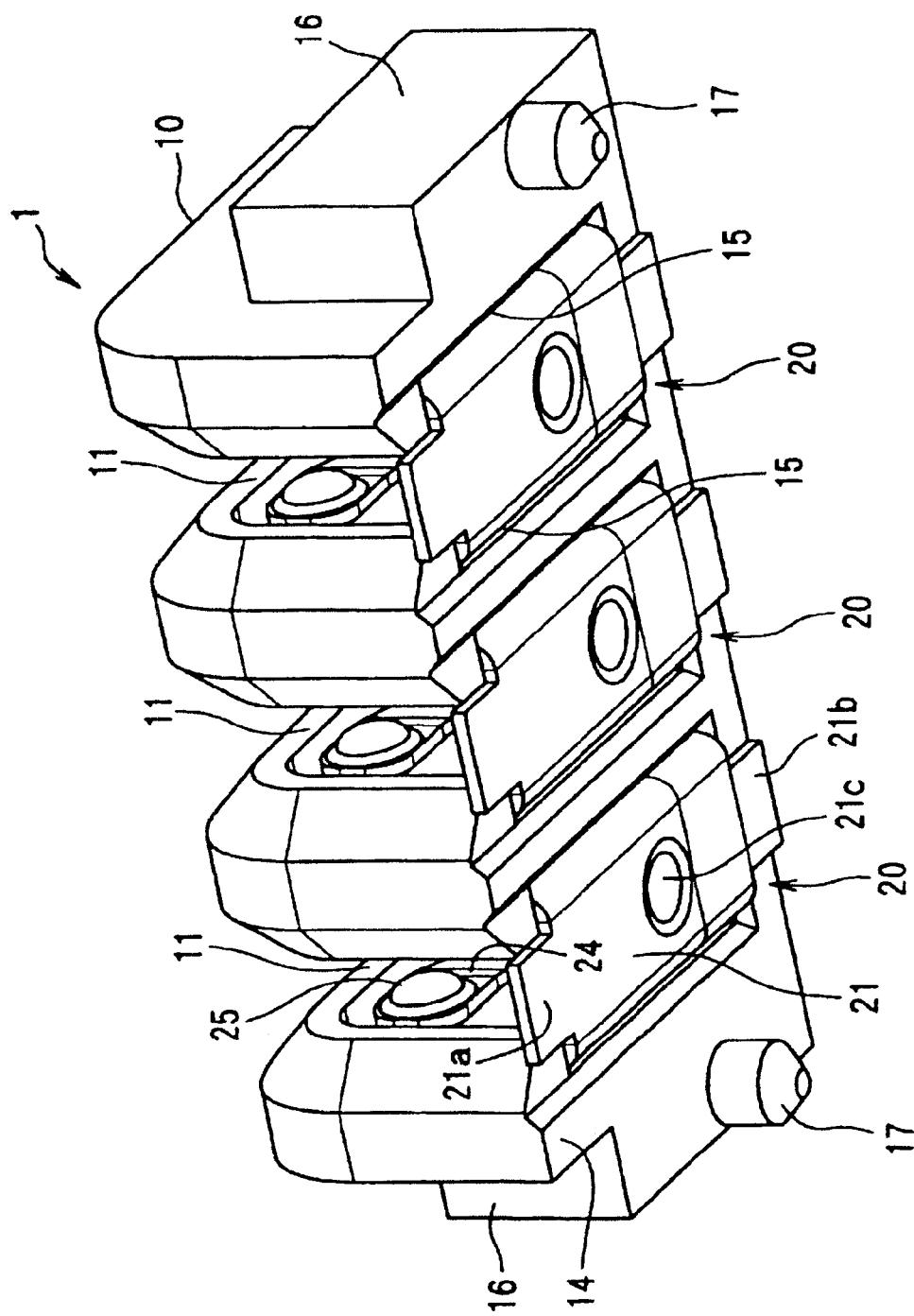
FIG. 2 is a perspective view of the bottom of the battery connector shown in FIG. 1 at an inclination.
Figure 3A:
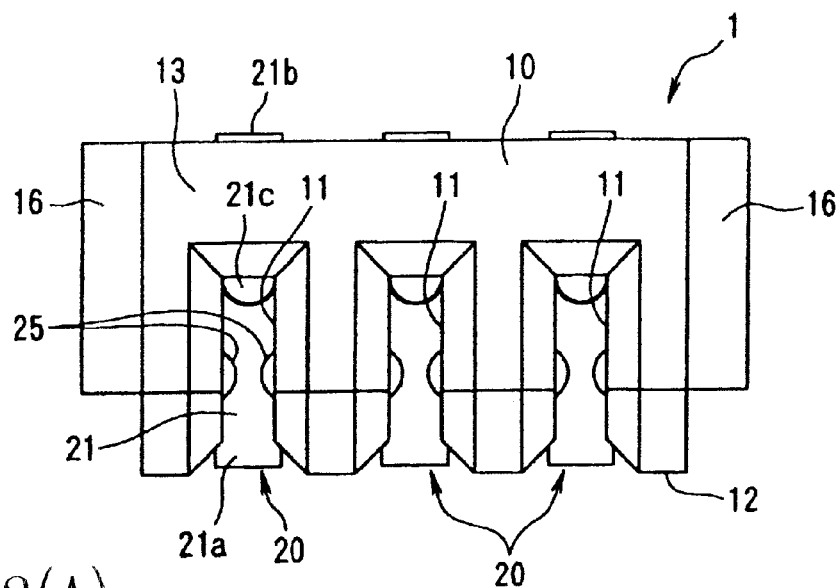
FIG. 3(A) is a plan view of the battery connector shown in FIG. 1.
Figure 3B:
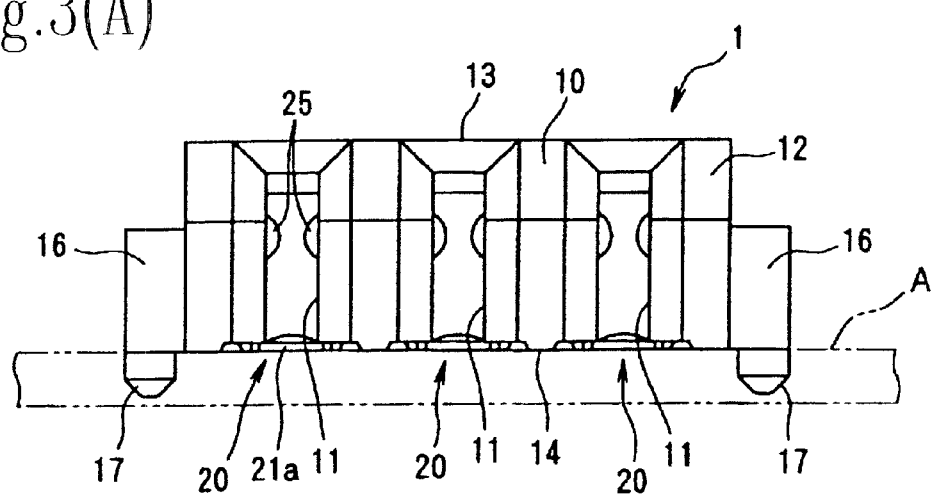
FIG. 3(B) is a front view of the battery connector shown in FIG. 1.
Figure 3C:
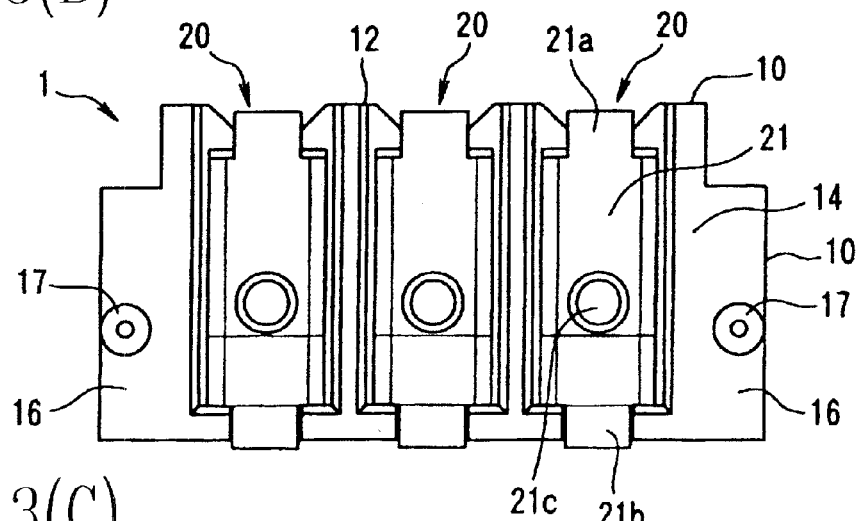
FIG. 3(C) is a bottom view of the battery connector shown in FIG. 1.

FIGS. 1 through 3 show a battery connector 1 that is either connected to batteries in a battery pack in the back cover of a portable telephone, or that is connected to batteries separately installed on the back cover side of a portable telephone. The battery connector 1 is mounted on a circuit board A (FIG. 3(B)) that is connected to the battery.

The battery connector is equipped with an insulating housing 10. A plurality of contacts 20 is provided in the insulating housing 10. The housing 10 has a substantially rectangular shape extending lengthwise and is formed by molding an insulating resin. A plurality of contact accommodating cavities 11 is formed at a specified pitch along the length of the housing 10. The cavities 11 accommodate the contacts 20. Each contact accommodating cavity 11 is formed so that it opens in the front surface 12 of the housing 10, and so that it passes entirely through the housing 10 from the upper surface 13 to the bottom surface 14.

Side wall accommodating recesses 15 are formed in both side walls of each contact accommodating cavity 11 so that the side wall accommodating recesses 15 open in the bottom surface 14 of the housing 10. The side wall accommodating recesses 15 accommodate both side wall parts 22 and both side wall extension parts 23 of corresponding contacts 20. A pair of protruding parts 16, that protrude lengthwise, are formed on both side walls of the housing 10 with respect to the direction of length. Positioning posts 17 are formed so that the posts 17 protrude downward on the bottom surfaces of the protruding parts 16. The positioning posts 17 position the battery connector 1 when the battery connector 1 is mounted on the battery connected circuit board A.

Figure 4:
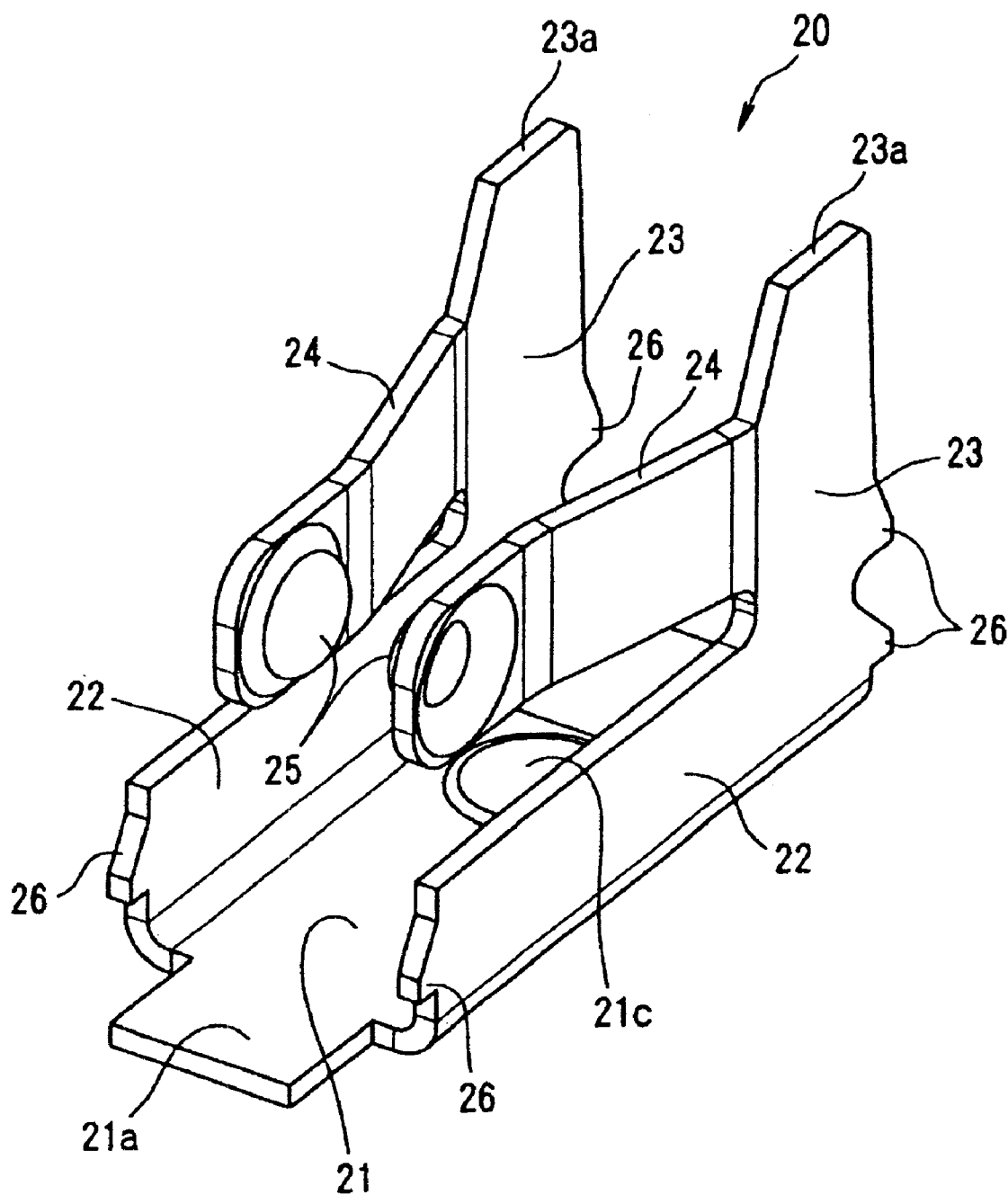
FIG. 4 is a perspective view of one of the contacts used in the battery connector shown in FIG. 1.

Each contact 20 has a flat-plate-form base part 21 that is formed by stamping and bending a metal plate (FIG. 4). The bottom surface of the base part 21 forms a soldering surface that is soldered to the circuit board A when the battery connector 1 is mounted on the circuit board A. The soldering surface is connected by soldering to a conductive pad on the surface of the circuit board A. Protruding plate parts 21a and 21b are formed so that the protruding plate parts 21a and 21b protrude from the front edge (the left edge in FIG. 4) and rear edge of the base part 21. The protruding plate parts 21a and 21b are used to increase the soldering area and for inspection of the soldered parts.

Shown most clearly in FIG. 2, a recessed part 21c used for the formation of a solder fillet is formed in the bottom surface of the base part 21 of each contact 20. A pair of side wall parts 22 that are substantially parallel to each other rise from the left and right sides of the base part 21. Side wall extension parts 23 rise from the upper edges of the rear ends of the side wall parts 22. A pair of contact arms 24 are disposed on the side wall extension parts 23. The contact arms 24 contact mating contacts 70 (FIG. 6) and extend forward facing each other from roughly the central portions (with respect to the vertical direction) of the front edges of the side wall extension parts 23.

Each of the contact arms 24 extends diagonally forward from the front edge of the corresponding side wall extension part 23 so that the contact arm 24 is inclined inward toward the opposite contact arm 24. The contact arm 24 is then bent so that it is substantially parallel to the corresponding side wall part 22. Contact projections 25 are formed so that the projections protrude inward on the tip end portions of the contact arms 24 and contact the mating contacts 70.

A plurality of barbs 26 are formed on the front and rear edges of the side wall parts 22 and the rear edges of the side wall extension parts 23 of the contacts 20 (FIG. 4). The barbs 26 are anchored in the front and rear walls of the side wall accommodating recesses 15 formed in the housing 10 when the side wall parts 22 and side wall extension parts 23 of the contacts 20 are accommodated in the side wall accommodating recesses 15. As a result, the contacts 20 are press-fitted to the housing 10.

The battery connector 1 can be assembled by inserting the side wall parts 22 and side wall extension parts 23 of the contacts 20 into the side wall accommodating recesses 15 from the bottom surface 14 of the housing 10. Insertion is made so that the contact projections 25 of the contact parts 24 are positioned at the front. The contacts 20 are then fastened to the housing 10 by press-fitting.

When press-fitting the contacts 20, the side wall parts 22 and side wall extension parts 23 of the contacts 20 are inserted into the side wall accommodating parts 15, so that the outer surfaces of the side wall parts 22 and side wall extension parts 23 contact the wall surfaces of the housing 10. The side wall parts 22 and side wall extension parts 23 are inserted until the upper edges 23a of the side wall extension parts 23 of the contacts 20 contact the upper walls (not shown) of the side wall accommodating recesses 15. Hence, the bottom surfaces of the flat-plate-form base parts 21 of the contacts 20 are substantially in the same plane as the bottom surface 14 of the housing 10 (FIG. 2 and FIG. 3(B)) hereby exposing all of the bottom surfaces. Because the bottom surfaces of the base parts 21 of the contacts 20 are exposed, it is not necessary to form a wall of the housing 10 beneath the base parts 21. Thus, the battery connector 1 is formed with a low height.

The contact arms 24 extend diagonally forward from the front edges of the side wall extension parts 23. Each contact arm 24 is inclined inward toward the opposite contact arm 24. The contact arms 24 are then bent so that the contact arms 24 are substantially parallel to the side wall parts 22. Hence, the contact arms 24 can flex in the inward-outward direction inside the contact accommodating cavities 11 after the contacts 20 have been press-fitted in the housing 10. Since the contacts 20 have sidewall parts 22 and extension parts 23 forming a C shape when viewed in cross-section, and since the outer surfaces of the side wall parts 22 are inserted into the side wall accommodating recesses 15, the strength of the housing is reinforced.

The assembled battery connector 1 is then mounted on the circuit board A connected to the battery. The bottom surfaces of the base parts 21 of the contacts 20 are soldered to conductive pads formed on the surface of the circuit board A. Because the base parts 21 are formed with a flat-plate shape extending between the two side wall parts 22, the area of the bottom soldering surface is relatively large allowing the soldering strength to be increased. As a result, there is no need for separate reinforcing members, and the area occupied by the battery connector 1 on the board is reduced.

The soldering positions of the base parts 21 are symmetrical with respect to the center in the short direction on the bottom surface of the battery connector 1. The balance of the soldering positions with respect to the battery connector 1 is thus improved, and the soldering parts can withstand insertion of the mating connector from any direction. Moreover, since recessed parts 21c used for the formation of solder fillets are formed in the bottom surfaces of the base parts 21, the soldering strength can be increased to a much greater extent when the base parts 21 are connected by soldering to the circuit board A.

Figure 5:
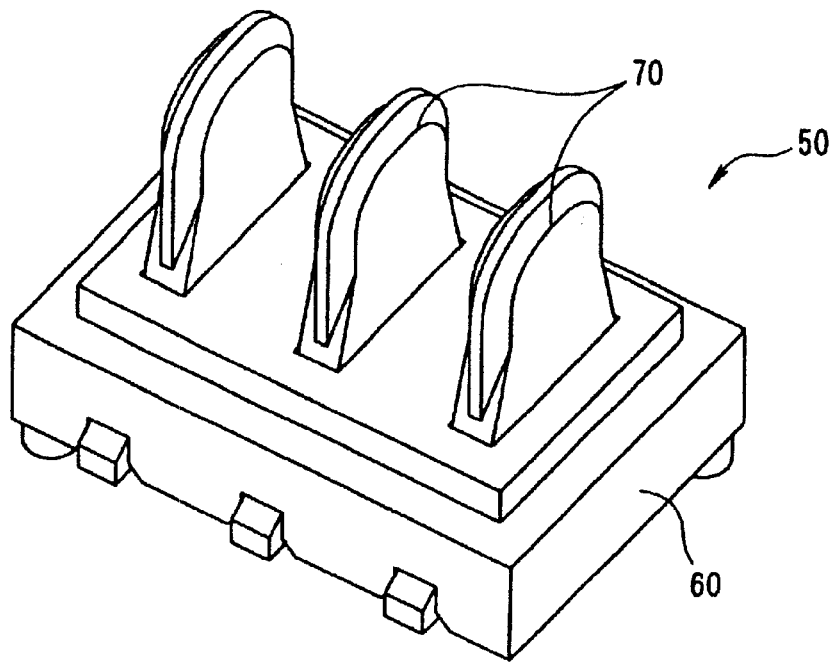
FIG. 5 is a perspective view of the mating connector.
Figure 6:
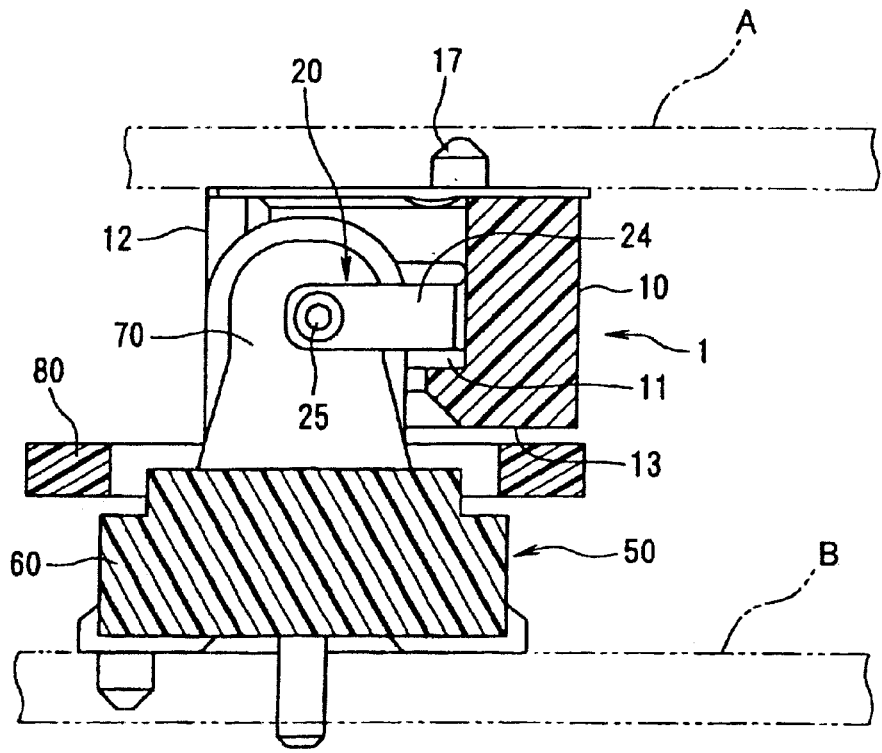
FIG. 6 is a sectional view of the engaged state of the battery connector and the mating connector.
Figure 7:
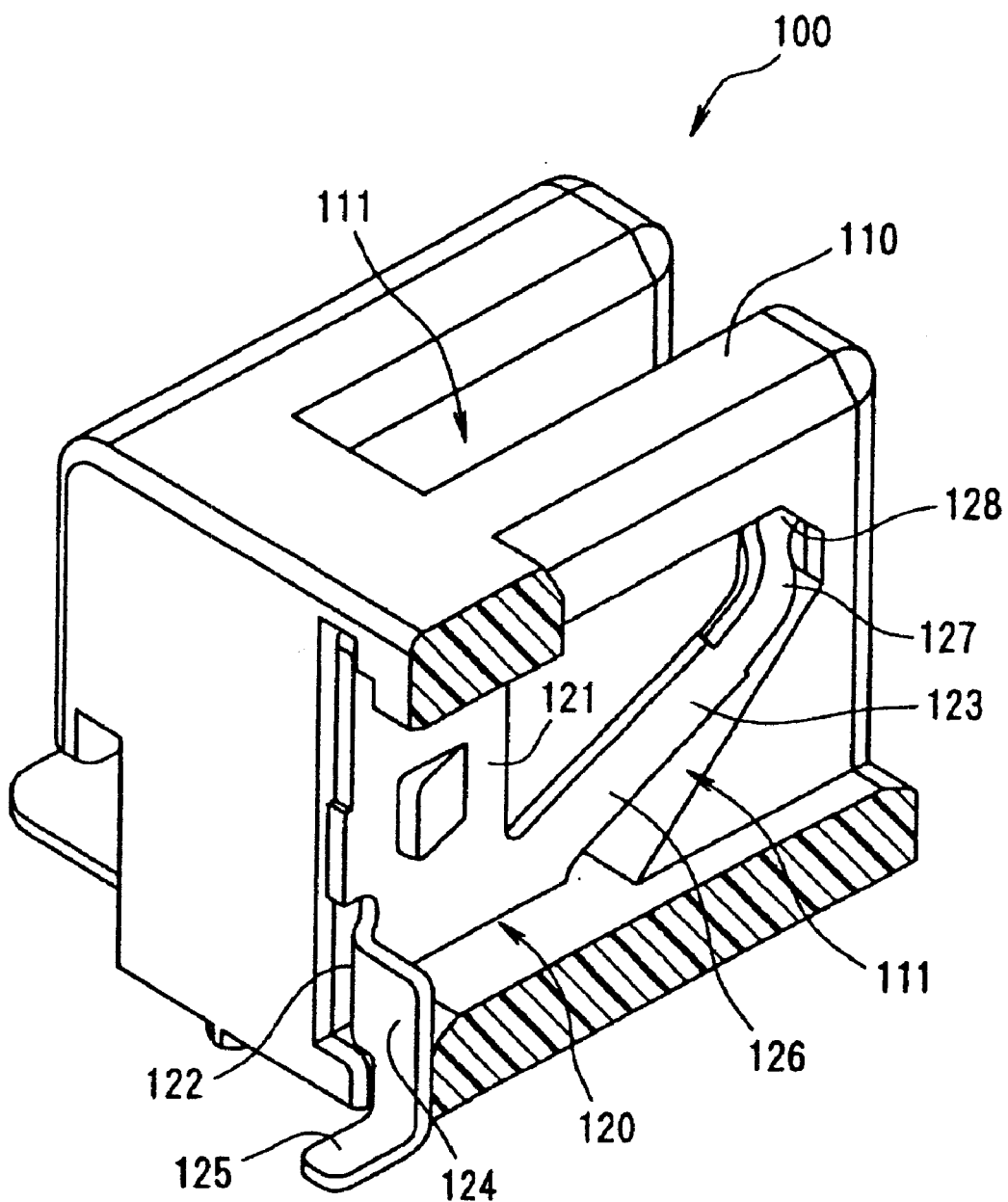
FIG. 7 is a partially sectional perspective view of a conventional battery connector known in the prior art.

Shown in FIGS. 5 and 6, the mating connector 50 is equipped with a rectangular insulating housing 60. A plurality of tab-form mating contacts 70 are disposed at a specified pitch lengthwise on the insulating housing 60. The mating connector 50 is engaged and connected with the battery connector 1 and is mounted on a circuit board B on the main body side of the portable telephone. The mating contacts 70 are attached to the housing 60 at the same pitch as the attachment pitch of the contacts 20 of the battery connector 1, so that the mating contacts 70 contact the contacts 20. The mating contacts 70 protrude from the upper surface of the insulating housing 60, and the bottom surfaces of the mating contacts 70 are soldered to conductive pads on the circuit board B.

During the use of the portable telephone, shown in FIG. 6, the back cover of the portable telephone is closed so that the back cover fits with the box body 80 on the main body side. The contact projections 25 of the pair of contact parts 24 of the contacts 20 of the battery connector 1 resiliently engage the mating contacts 70 of the mating connector 50 from above. As a result, the contacts 20 and mating contacts 70 contact each other, so that the battery is connected to the circuit board B. Power is therefore supplied from the battery to the circuit board B.

The contact accommodating cavities 11 of the housing 10 are formed so that the contact accommodating cavities 11 pass entirely through the housing 10 from the upper surface 13 to the bottom surface 14. The mating contacts 70 enter the contact accommodating cavities 11 from the side of the upper surface 13 of the housing 10, and enter the spaces between the contact projections 25 of the contact parts 24. The contact accommodating cavities 11 also open in the front surface 12 of the housing 10. The contact projections 25 are positioned on the front ends of the contact parts 24, so that the contact projections 25 of the contacts 20 can contact the mating contacts 70 not only from above, but also from both sides.

When it is necessary to replace the battery, the reverse of the procedure described above releases the battery connector 1 and mating connector 50. A new battery is then mounted.

While the present invention has been described in connection with the illustrated embodiments, it will be appreciated and understood that modifications may be made without departing from the true spirit and scope of the invention. For example, the pair of contact arms 24 extend forward, facing each other, from roughly the central portions of the front edges of the side wall extension parts 23, however, it would also be possible to cause the parts to extend facing each other directly from the side wall parts 22.

We claim:

1. A battery connector comprising:
   an insulating housing having a cavity opening toward a side, top and bottom surface of the housing;
   a plurality of contacts positioned in the cavity of the insulating housing;
   each contact having a flat-plate-form base part with a front edge, rear edge, and bottom surface, a pair of side wall parts that rise from both sides of the flat-plate-form base part, and a pair of contact arms that extend facing each other from the respective side wall parts of the pair of side wall parts; and
   the bottom surface of the flat-plate-form base part of the contacts forms a soldering surface substantially in the same plane as the bottom surface of the housing so that the soldering surface is exposed for soldering to a circuit board.

2. The battery connector of claim 1, wherein the flat-plate-form base part of each contact has a recessed part used to form a solder fillet on the bottom surface of the flat-plate-form base part of each contact.

3. The battery connector of claim 1, wherein the contact arms have contact projections that protrude inward on tip end portions of the contact arms to contact the mating contacts.

4. The battery connector of claim 1, wherein the flat-plate-form base part of each contact is soldered in a position symmetrical with respect to the center in the short direction on a bottom surface of a battery connector.

5. The battery connector of claim 1, wherein the contacts are press lit into the housing.

6. The battery connector of claim 1, wherein the side wall parts have extension parts that rise from upper rear edges of the side wall parts.

7. The battery connector of claim 6, wherein the contact arms extend forward facing each other from roughly central portions of front edges of the side wall extension parts.

8. The battery connector of claim 7, wherein the contact arms extend diagonally forward from the front edge of the corresponding side wall extension part so that one contact arm is inclined inward toward the opposite contact arm.

9. The batter connector of claim 8, wherein the contact arms have tip end portions substantially parallel to the side wall parts.

10. The battery connector of claim 6, wherein the side wall parts and side wall extension parts have barbs.

11. The battery connector of claim 10, wherein the barbs are formed on front and rear edges of the side wall parts and rear edges of the side wall extension parts.

12. The battery connector of claim 1, wherein the housing has contact accommodating cavities having side walls and formed at a specific pitch along the direction of length of the housing.

13. The battery connector of claim 12, wherein the side walls of the contact accommodating cavities have side wall accommodating recesses that open on the bottom surface of the housing and that accommodate the side wall parts and side wall extension parts that rise from upper edges of rear ends of the side walls.

14. The battery connector of claim 1, wherein the flat-plate-form base part of each contact has protruding plate parts that protrude from the front edge and rear edge of the flat-plate-form base part of each contact.

15. The battery connector of claim 14, wherein the protruding plate parts extend from the flat-plate-form base to increase the soldering surface.

16. The battery connector of claim 1, wherein mating tabs of a mating connector are received in the cavity from the top and side surfaces of the housing.

17. The battery connector of claim 16, wherein the contacts are received in the cavity from the bottom surface of the housing.

* * * * *